US007068126B2

(12) United States Patent
Huang et al.

(10) Patent No.: US 7,068,126 B2
(45) Date of Patent: Jun. 27, 2006

(54) METHOD AND APPARATUS FOR FREQUENCY TUNING OF A MICRO-MECHANICAL RESONATOR

(75) Inventors: Xiangxiang Huang, Solon, OH (US); James D. MacDonald, Rockwall, TX (US); Wan-Thai Hsu, Ann Arbor, MI (US)

(73) Assignee: Discera, Ann Arbor, MI (US)

( * ) Notice: Subject to any disclaimer, the term of this patent is extended or adjusted under 35 U.S.C. 154(b) by 36 days.

(21) Appl. No.: 10/793,047

(22) Filed: Mar. 4, 2004

(65) Prior Publication Data

US 2005/0195049 A1 Sep. 8, 2005

(51) Int. Cl.
*H03H 3/013* (2006.01)
*H03H 9/10* (2006.01)

(52) U.S. Cl. ................ 333/188; 310/312; 29/25.35
(58) Field of Classification Search .............. 333/188; 29/25.35; 310/312
See application file for complete search history.

(56) References Cited

U.S. PATENT DOCUMENTS

| 4,562,370 | A | * | 12/1985 | Von Dach | 310/312 |
| 5,662,782 | A | * | 9/1997 | Gomi et al. | 204/192.34 |
| 6,114,795 | A | * | 9/2000 | Tajima et al. | 310/312 |
| 6,570,468 | B1 | | 5/2003 | Ma et al. | 333/188 |
| 6,600,389 | B1 | | 7/2003 | Ma | 333/186 |
| 6,604,266 | B1 | | 8/2003 | Tajima | 29/25.35 |
| 6,628,179 | B1 | * | 9/2003 | Yatsuda et al. | 333/193 |
| 6,657,363 | B1 | * | 12/2003 | Aigner | 310/324 |
| 6,698,287 | B1 | * | 3/2004 | Kubena et al. | 73/504.12 |
| 6,922,118 | B1 | * | 7/2005 | Kubena et al. | 333/188 |
| 2004/0183603 | A1 | * | 9/2004 | Ma et al. | 331/68 |

OTHER PUBLICATIONS

Daphne Joachim, Liwei Lin, Characterization of Selective Polysilicon Deposition for MEMS Resonator Tuning, Journal of Microelectromechanical Systems, Apr. 2003, 193-200, vol. 12, No. 2, IEEE.
Liwei Lin, Roger T. Howe, Albert P. Pisano, Microelectromechanical Filters for Signal Processing, Journal of Microelectromechanical Systems, Sep. 1998, 286-294, vol. 7, No. 3, IEEE.

(Continued)

*Primary Examiner*—Barbara Summons
(74) *Attorney, Agent, or Firm*—DeMont & Breyer, LLC

(57) ABSTRACT

A method for modifying the resonance frequency of a micro-mechanical resonator, and resonators on which the method is practiced. A packaged resonator is trimmed by directing electromagnetic energy to the resonator through a transparent portion of the package. The removal of mass (by the energy) affects the resonance frequency of the resonator in a predictable manner. In some embodiments, the energy is sourced from a femtosecond laser. In some variations of the illustrative embodiment, the amount of mass to be removed is determined as a function of its location on the resonator. A mass-trimming map is developed that identifies a plurality of potential mass-trimming sites on the resonator. A site can be classified as a fine-tuning site or a coarse-tuning site as a function of the degree to which mass removal at those sites affects the resonance frequency. The sites can also be characterized as a function of their position relative to features of the resonator (e.g., nodal lines, etc.). Based on a differential between the measured and desired resonance frequency of the resonator, and expressions that relate resonance frequency to location-dependent mass, actual sites for mass removal are selected from among of the plurality of potential mass-trimming sites.

30 Claims, 5 Drawing Sheets

OTHER PUBLICATIONS

K. Wang, A.-C. Wong, W.-T.Hsu, C.T.-C.Nguyen, Frequency-trimming and Q-factor enhancement of micromechanical resonators via localized filament annealing, International Conference on Solid-State Sensors and Actuators, Jun. 16-19, 1997, 109-112, vol. 1, Digest of Technical Papers, Chicago, Illinois.

Kun Wang, Ark-Chew Wong, Clark T.-C.Nguyen, VHF Free—Free Beam High-Q Micromechanical Resonators, Journal of Microelectromechanical Systems, Sep. 2000, 347-360, vol. 9, No. 3, IEEE.

T.M.Bloomstein, D.J.Ehrlich, Laser Deposition and Etching of Three-Dimensional Microstructures, 1991, 507-511, IEEE.

E C Harvey, P T Rumsby, M C Glower, S Mihailov, D Thomas, Excimer Lasers for Micromachining, The Institute of Electrical Engineers, 1994, 1-4, IEE.

E C Harvey, Laser Micromachining, The Institute of Electrical Engineers, 1997, 3/1-3/2, IEE.

* cited by examiner

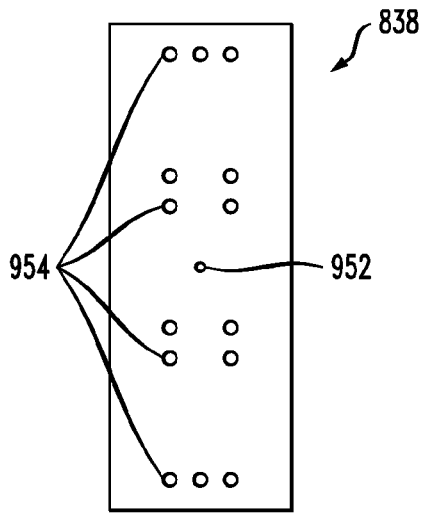
FIG. 9A
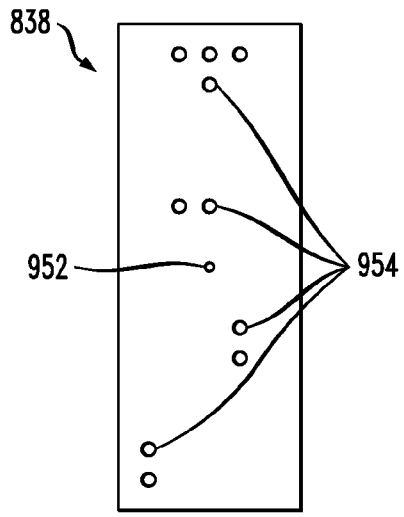
FIG. 9B
FIG. 10
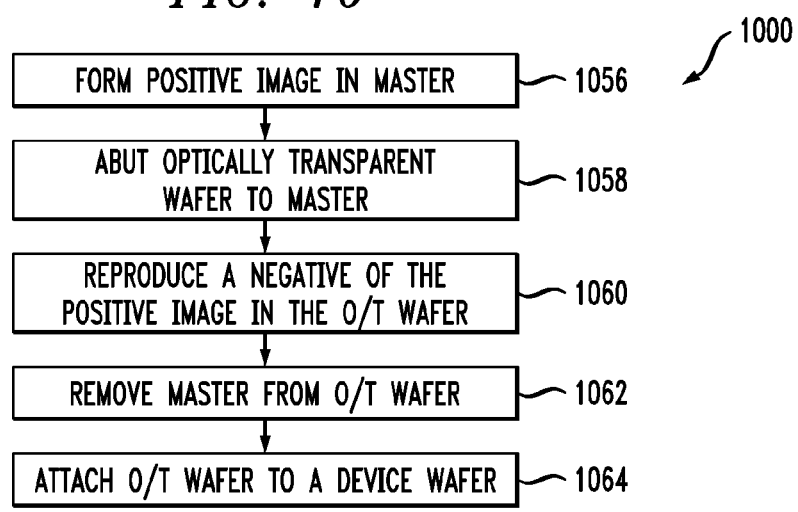
FIG. 11
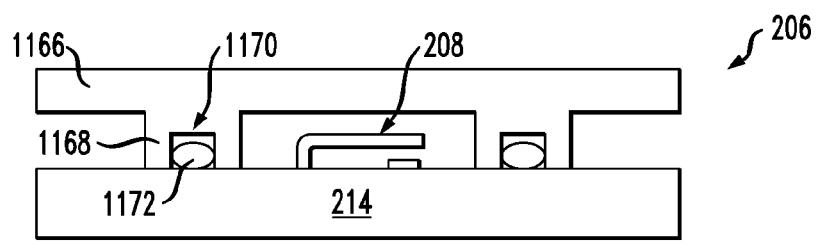

METHOD AND APPARATUS FOR FREQUENCY TUNING OF A MICRO-MECHANICAL RESONATOR

FIELD OF THE INVENTION

The present invention relates to micro-electromechanical systems ("MEMS"), and, more particularly, to frequency trimming of MEMS resonators.

BACKGROUND OF THE INVENTION

MEMS resonators are now being developed for use in frequency-specific applications, such as oscillator references and highly-selective bandpass filters. These applications require that the resonator possess a specific resonance frequency. For example, in the case of an oscillator that serves as part of a clock circuit, it is important that the resonator vibrates at a specific frequency. In the case of a filter, a resonator must likewise vibrate at a particular, targeted frequency to generate a passband to selectively pass or reject a signal as a function of frequency.

Due to the vagaries of manufacturing, the measured resonance frequency of a resonator is typically different from its targeted value. Variations of about 5 percent are typical. As a consequence, a newly-manufactured resonator often needs to be tuned to adjust its resonance frequency. Tuning of a resonator is akin to tuning a piano, although the techniques used are quite different. The process of tuning a resonator is called "trimming."

Frequency trimming is well-known. Indeed, it is commonplace to trim the resonance frequency of piezo-electric components (e.g., crystals, etc.), and resonators, oscillators, and clocks that incorporate them. Unfortunately, the techniques that are used for frequency trimming these devices are not well adapted for use with MEMS resonators.

For example, laser trimming has traditionally been used to trim the resonance frequency of crystals. But laser trimming has not been considered to be a viable technique for use with MEMS resonators since they are typically much smaller in size than their crystal counterparts. Also, it is desirable to trim a MEMS resonator after it has been packaged, but doing has not been considered to be feasible via laser. (See, e.g., Joachim et al., "Characterization of Selective Polysilicon Deposition for MEMS Resonator Tuning," J. MEMS, v(12), no.2, pp. 193–200 (April 2003) at p. 193; Lin et al., "Microelectromechanical Filters for Signal Processing," J. MEMS, v(7), no.3, pp. 286–294 (September 1998) at p. 293; U.S. Pat. No. 6,600,389 at col. 1, lines 33–39, and U.S. Pat. No. 6,570,468 at col. 1, lines 27–34).

Other techniques that have been used to trim piezo-electric components include removing mass by polishing or adding mass by depositing a resin (see, e.g., U.S. Pat. No. 6,604,266 at col. 1, lines 20–49). These techniques are not well suited for trimming MEMS resonators either. In particular, the very small size (micron and even submicron size) of MEMS resonators makes polishing and selective deposition difficult. Furthermore, the spring constant of the resonator is very sensitive to beam thickness. Variations in the spring constant, such as can be caused by removal or addition of material, will affect the quality factor, Q, of the resonator.

Since frequency-trimming techniques that have been used for piezo-electric components are not readily adapted for use with a MEMS resonator, new frequency-trimming techniques have been developed.

In a first frequency-trimming technique that is useful with MEMS resonators, the resonance frequency of a resonator is changed by modifying a structure that supports the resonator. See, U.S. Pat. No. 6,570,468. In this technique, the resonance frequency of a resonator is altered by changing the stiffness of a supporting structure. According to the patent, the stiffness of the supporting structure is modified by forming notches therein or by adding material thereto.

In a second approach to the problem of tuning a MEMS resonator, a structure having a plurality of beams of variable length is formed. See, U.S. Pat. No. 6,600,389. According to this approach, the variation in beam length results in a difference in resonance frequency between the shortest and longest beam that is sufficient to account for the typical variation (due to manufacturing tolerances) in the resonance frequency of a resonator. This patent also discloses that the increment in resonance frequency between adjacent beams is smaller than the targeted frequency variation tolerance of the desired resonator. Therefore, one of the beams will be qualified to serve as the desired resonator. Once that beam is identified, the other beams are disabled.

The techniques described in U.S. Pat. Nos. 6,570,468 and 6,600,389 are performed before the resonator is packaged. But typically, resonators must be operated under high vacuum conditions. To the extent that the techniques described in U.S. Pat. Nos. 6,570,468 and 6,600,389 are not performed under high-vacuum—the environment of a packaged resonator—there will be uncertainty as to the amount of frequency trimming that is required.

Furthermore, it is known that the resonator packaging itself can affect the resonance frequency of a resonator (see, e.g., Lin et al. at p. 293). In other words, the resonance frequency of a resonator can differ before and after encapsulation in a package. Since the first and second techniques discussed above and described in U.S. Pat. Nos. 6,570,468 and 6,600,389 are conducted before the resonator is packaged, there is, again, uncertainty as to how much frequency trimming is required.

In a third approach, which is referred to by its inventors as "localized annealing" or "filament annealing," the resonator is trimmed after it is packaged. According to this approach, voltage pulses are applied to the resonator. This causes filament-like heating of portions of the resonator, which results in frequency trimming and improvements in Q. See, Wang et al., "Frequency Trimming and Q-Factor Enhancement of Micromechanical Resonators Via Localized Filament Annealing," Dig. Tech. Papers, v(1), 1997 Int'l Conf. Solid-State Sensors and Actuators, Chicago, Ill., pp. 109–112 (Jun. 16–19, 1997).

While the third technique avoids the drawback of the first two approaches (i.e., trimming before packaging), it has some other deficiencies. In particular, the degree of trim control and Q control is very dependent upon the method used to dope the resonators in addition to other process-related variations.

As a consequence, there is a need for a method for trimming the resonance frequency of MEMS resonators that avoids at least some of the problems of the prior art.

SUMMARY

An illustrative embodiment of the present invention is a method for modifying (i.e., trimming) the resonance frequency of a micro-mechanical resonator. The method avoids at least some of the drawbacks of the prior art.

In accordance with the illustrative embodiment, a packaged resonator is trimmed by directing electromagnetic energy to the resonator through a transparent portion of the resonator package. The energy removes (e.g., ablates, etc.) mass at the point(s) of contact on the resonator. Removing mass from the resonator affects its resonance frequency in a predictable manner. In some embodiments, the electromagnetic energy is sourced from a femtosecond laser.

In some variations of the method, debris that is generated during mass removal is electrostatically attracted to a remote region of the package, away from the resonator.

In some further variations of the illustrative embodiment, frequency trimming is a function of (1) the amount of mass removed from the resonator and (2) the location(s) on the resonator at which the mass is removed. That is, once the frequency-trimming requirement is determined (i.e., how much change in resonance frequency is required), the trimming is implemented by removing mass from selected locations on the resonator, since the change in frequency caused by removing mass is not only a function of the amount of mass, but also its location on the resonant element. In some embodiments, a mass-trimming map is developed or otherwise utilized. The map identifies a plurality of potential mass-trimming sites on the resonator. Each site can be classified as a "fine-tuning" site or a "coarse-tuning" site as a function of the magnitude of the change in resonance frequency that is caused by removing (a given amount of) mass at that site. Fine-tuning sites and coarse tuning sites tend to group in different regions on the resonator as a function of the aforementioned relationship between resonance frequency and mass location.

Based on a differential between the measured and desired resonance frequency of the resonator, and expressions that relate resonance frequency to location-dependent mass (among other parameters), some of the (potential) sites on the map are selected as (actual) sites on the resonator for mass removal.

Also described are embodiments of a packaged micromechanical resonator suitable for frequency trimming in accordance with the illustrative method. In accordance with an illustrative embodiment, at least a portion of the package is transparent to the electromagnetic energy that will be used to trim the resonator.

The package encapsulates the resonator in a substantially pressure-tight cavity and advantageously maintains it under vacuum. In some embodiments, electrodes, which are contained within the cavity, can be biased to a voltage that is suitable for attracting debris that is generated during the trimming operation.

Some embodiments of micro-mechanical resonators that have been trimmed in accordance with the method will have a plurality of divots in the surface thereof. The divots result from mass removal during trimming operations. In some variations, the divots will be located symmetrically on the resonator surface. This symmetric arrangement has the effect of changing the resonance frequency while the quality factor, Q, of the resonator remains substantially unaffected. In some other variations, the divots will be asymmetrically located. This asymmetric arrangement results in a change in both the resonance frequency and the quality factor of the resonator.

For reasons previously discussed, it is advantageous (but not necessary) to perform the method on a packaged micromechanical resonator. In some variations of the illustrative embodiment, however, the method is performed before the resonator is packaged.

BRIEF DESCRIPTION OF THE DRAWINGS

FIG. 9A depicts a symmetric arrangement of sites at which mass is removed from a resonator.

FIG. 9B depicts an asymmetric arrangement of sites at which mass is removed from a resonator.

FIG. 10 depicts a method for forming a package in accordance with the illustrative embodiment.

FIG. 11 depicts a package formed from the method of FIG. 10.

DETAILED DESCRIPTION

In this Specification, numerous specific details are disclosed in order provide a thorough description and understanding of the illustrative embodiments of the present invention. Those skilled in the art will recognize, however, that the invention can be practiced without one or more of the specific details, or with other variations of the illustrative methods, materials, components, etc. In some instances, well-known structures, materials, or operations are not shown or described in detail to avoid obscuring aspects of the illustrative embodiments.

It is understood that the various embodiments shown in the Figures are illustrative representations, and are not necessarily drawn to scale. Reference throughout the specification to "one embodiment" or "an embodiment" or "some embodiments" means that a particular feature, structure, material, or characteristic described in connection with the embodiment(s) is included in at least one embodiment of the present invention, but not necessarily in all embodiments. Consequently, appearances of the phrases "in one embodiment," "in an embodiment," or "in some embodiments" in various places throughout the Specification are not necessarily referring to the same embodiment. Furthermore, the particular features, structures, materials, or characteristics can be combined in any suitable manner in one or more embodiments.

Figure 1:
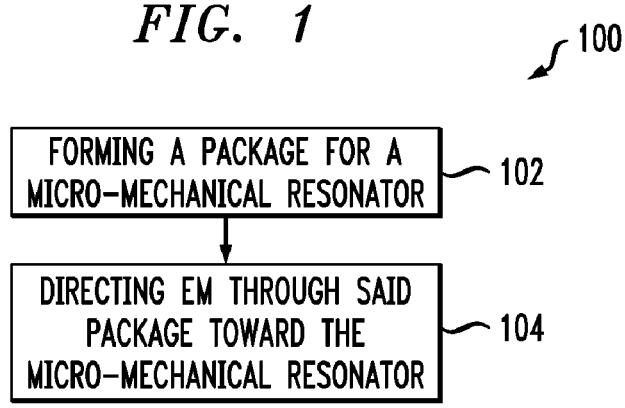
FIG. 1 depicts a flow diagram of a method in accordance with the illustrative embodiment of the present invention.

FIG. 1 depicts a flow diagram of the salient operations of method 100 in accordance with the illustrative embodiment of the present invention. In the illustrative embodiment, method 100 is used to trim the resonance frequency of a micro-mechanical resonator. Typically, and for use herein, the prefix "micro" in the term "micro-mechanical" refers to devices that have size between about 100 nanometers to several millimeters. It will be recognized, of course, that these micro-mechanical devices will often include structures or components having even smaller dimensions (i.e., less than 100 nanometers).

Figure 2:
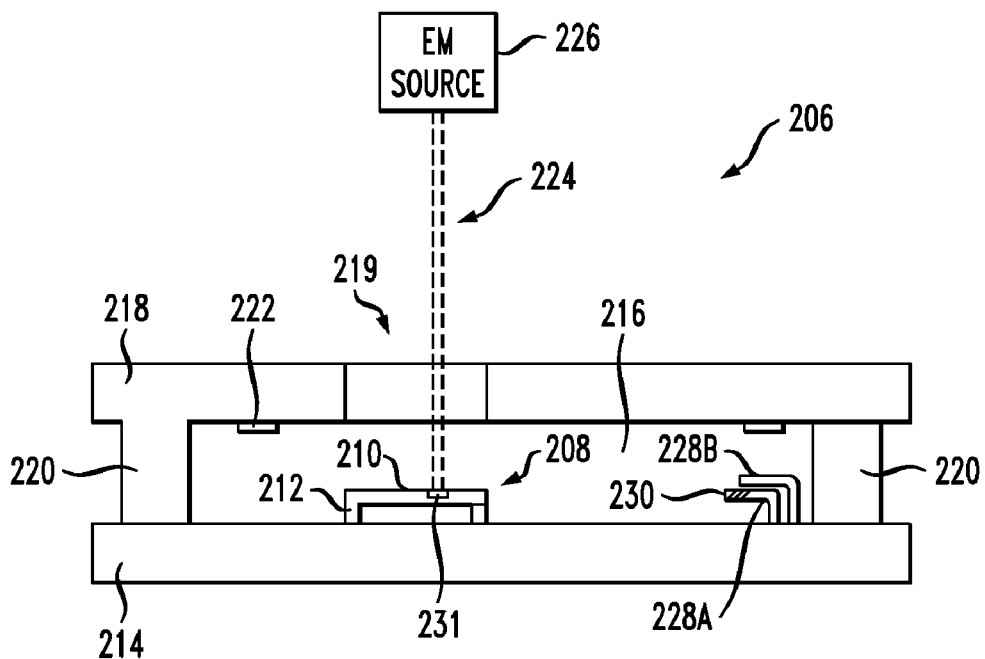
FIG. 2 depicts a packaged resonator in accordance with the illustrative embodiment of the present invention.

In accordance with operation 102 of method 100, a package for a micro-mechanical resonator is formed. FIG. 2 depicts features of package 206, and of micro-mechanical resonator 208 encapsulated thereby, upon which method 100 can be practiced.

Packages and packaging methods for micro-mechanical devices, such as resonator 208, are varied and well known in the art. For example, packages can be formed via wafer-to-wafer bonding by means of anodic bonding, thermocompression bonding, low-temperature fusion bonding, solder bonding, or glass-frit bonding. Furthermore, other means for sealing that use direct bonding of materials commonly used in existing semiconductor processing can also be used. With the exception of a few features described below, neither the package nor packaging methods are described in detail herein because they are not germane to an understanding of the illustrative embodiments of the present invention. For further detail concerning packages and packaging methods for a micro-mechanical resonator, see, e.g., U.S. patent application Ser. No. 10/632,165, incorporated by reference herein.

Likewise, a variety of designs for a micro-mechanical resonator, such as micro-mechanical resonator 208, are known in the art, many of which are suitable for use in conjunction with the illustrative embodiment of the present invention. Consequently, resonator design and operation will not be described in detail here unless it furthers an understanding of the present invention. Additional detail concerning the design and operation of micro-mechanical resonators, see, e.g., U.S. Pat. Nos. 6,249,073 B1, 6,169, 321, and 5,976,994; Publ. U.S. Pat. Apps. US 2002/0070816 A1 and US 2003/0051550 A1; Nguyen et al., "Micromachined Devices for Wireless Telecommunications," *Proc. IEEE*, v.(86), no.8, pp. 1756–1768 (August 1998); Wang et al., "VHF Free-Free Beam High-Q Micromechanical Resonators," *Technical Dig., Int'l IEEE Micro Electro Mechanical Systems Conf.*, Orlando, Fla., pp. 453–458 (Jan. 17–21, 1999); Nguyen et al., "Frequency-Selective MEMS for Miniaturized Low-Power Communication Device," *IEEE Trans. Microwave Theory Tech.*, v(47), no.8, pp. 1486–1503 (August 1999); Bannon et al., "High Frequency Micromechanical Filters," *IEEE J. Solid-State Cir.*, v(35), n. 4, pp. 512–526 (April 2000); Nguyen et al., "Transceiver Front-End Architectures Using Vibrating Micromechanical Signal Processors," *Dig. Of Papers, Topical Mtg on Silicon Monolithic Integrated Circuits in RF Systems*, pp. 23–32 (Sep. 12–14, 2001); and Nguyen, "Vibrating RF MEMS for Low Power Wireless Communications," *Proc. 2000 Int'l. MEMS Workshop (iMEMS '01)*, Singapore, pp. 21–34 (July 2001). Each of these references is incorporated herein in its entirety.

As depicted in FIG. 2, micro-mechanical resonator 208, which includes resonant element 210 and supports 212, is disposed on device substrate 214. Typically, resonator 208 is formed from a silicon-containing material (e.g., silicon nitride, silicon-on-insulator, silicon carbide, polysilicon, single-crystal silicon), although other materials, such as metals or compound semiconductors (e.g., gallium arsenide, etc.), can suitably be used. Micro-mechanical resonator 208 resides within cavity 216, which is advantageously kept under vacuum, at a pressure that is typically $10^{-3}$ milliTorr or less. Cavity 216 is formed by attaching cap 218 to substrate 214. In the illustrative embodiment, cap 218 includes ridges 220, which abut substrate 214 and serve as a standoff to form cavity 216. The cavity is typically formed under high temperature, as is usually required to bond cap 218 to substrate 214. The temperature can vary substantially (e.g., 300° C. to 1100° C., etc.) as a function of the bonding method used. As package 206 cools, a vacuum is created in cavity 216.

In the illustrative embodiment, package 206 includes non-evaporated getter 222, which is used for maintaining the vacuum level. The decision to incorporate getter 222 in package 206 is a function of the pressure in cavity 216. That is, as pressure is reduced (i.e., greater vacuum), it is more likely that getter is required to maintain the low pressure. Resonators that are operating at relatively lower frequency require a relatively lower pressure (i.e., greater vacuum) in cavity 216. For example, for a resonator operating at 32 KHz, the pressure must be maintained at about 1 milliTorr. To maintain such a low pressure, getter 222 should be used. For a resonator operating at 19 MHz, the pressure must be maintained at about 10–100 milliTorr. At this relatively higher pressure level, getter 222 might not be required. And for a resonator operating at 1 GHz, the pressure should be maintained at about 1–10 Torr. At this yet higher pressure level, getter 222 is typically not required. Therefore, the lower the operating frequency of resonator 208, the more likely it is that getter 222 is required.

In operation 204 of method 100, electromagnetic energy 224 is directed from EM source 226 through package 206 toward micro-mechanical resonator 208. Contact between resonator 208 and electromagnetic energy 224 causes the removal of a small amount of mass of resonator 208 at the point of contact. In accordance with the illustrative embodiment, the point of contact will be somewhere on resonant element 210. Removal of the mass creates divot 231 in resonant element 210.

In accordance with the illustrative embodiment, a femtosecond laser is used as EM source 226. Electromagnetic energy 224 from a femtosecond laser ablates (i.e., creates a plasma) mass from resonator 208. It is advantageous (but not necessary) to use a femtosecond laser as the EM source because it causes very little heating beyond the point of contact. While other EM sources can be used, such as picosecond lasers, heating of resonator 208 beyond the point of contact is likely to occur. Such heating can deleteriously and unpredictably affect the performance of resonator 208. As described in more detail later in this specification, electromagnetic energy 224 delivers an amount of energy in the range of about 10 to about 50 nanojoules to resonator 208. Furthermore, that amount of energy is advantageously delivered to resonator in about 150 femtoseconds or less.

At least a portion of package 206 must be transparent, at the operating wavelength of EM source 226, so that electromagnetic energy 224 can reach resonator 208.

In the illustrative embodiment, EM source 226 is disposed above cap 218; consequently, at least a portion of cap 218 must be transparent to energy from this source. In some embodiments, cap 218 is made of a material that is optically transparent at the wavelengths of interest. In some other embodiments, a window 219 of suitable material is provided within cap 218. The specific choice of material is a mainly a function of the operating wavelength of EM source 226 and the coefficient of thermal expansion of the transparent portion. That is, the coefficient of thermal expansion of cap 218, or of window 219 within cap 218, etc., will advantageously match the coefficient of thermal expansion of resonator 208 or substrate 214, or both. Methods for forming an optically-transparent cap are described later in this specification.

In embodiments in which a femtosecond laser is used as EM source 226, cap 218 or the transparent portion thereof can be made of Pyrex™ or fused silica. When using a femtosecond laser to trim, a "beam focus angle" of up to 25 degrees (included angle) is advantageously used. As used herein, the term "beam focus angle," the specified range, and the term "included angle," means that electromagnetic energy 224 should be directed toward resonator 208 focusing to a spot that is approximately 0.25 microns to 1 micron in diameter (and more typically about 0.5 to about 0.7 microns in diameter) and at an angle that is no more than about 12.5° with respect to an axis that is normal to the upper surface of resonant element 210.

When electromagnetic energy 224 contacts resonator 208, rapid heating of the resonator at the point of contact produces a plasma cloud of ionized materials (e.g, atoms and ions) and other small particles, hereinafter "debris." As described in further detail later in this specification, it is desirable to generate mostly plasma. The reason for this is that the charged debris that is generated disperses over a wide area within cavity 216. Often, the debris re-deposits on resonator 208 and surrounding surfaces. This creates a risk of degraded performance. In particular, the debris generated from trimming can become trapped between resonant element 210 and underlying substrate 214. This can interfere with unfettered movement of resonator 208. Furthermore, if debris that has settled within cavity 216 later moves to another position on or off of resonator 208, the resonance characteristics of the resonator will change.

In accordance with some embodiments of a method in accordance with the present invention (see, e.g., FIG. 6: method 600, operation 626), debris that is formed during mass removal is electrostatically attracted to a location that is relatively distant from resonator 208, yet still within cavity 216. To this end, in some embodiments, package 206 includes electrodes 228A and 228B. These electrodes are biased, during trimming, to a voltage that is capable of electrostatically attracting the debris and keeping it away from resonator 208.

The debris tends to remain at the electrodes (after the biasing voltage is withdrawn) due to a surface-charge attraction. Since this behavior is desirable, it is promoted by fabricating electrodes 228A and 228B so that they are advantageously free of a surface passivation layer. A surface passivation layer is usually applied to MEMS structures to prevent particles from sticking, among other reasons. If present, the passivation layers would hinder the retention of debris.

Selective passivation of MEMs structures, whereby electrodes 228A and 228B are left untreated, can be accomplished by means such as protecting the electrodes (with an added layer, etc.) to prevent deposition of passivation layers or by selectively heating the electrodes after deposition to remove the passivation layers.

Furthermore, in some embodiments, narrow features 230 can be formed (e.g., photo-lithographically patterned, etc.) in electrodes 228A and 228B to create channels. The channels aid in trapping the debris in conjunction with the surface-charge attraction.

Figure 3:
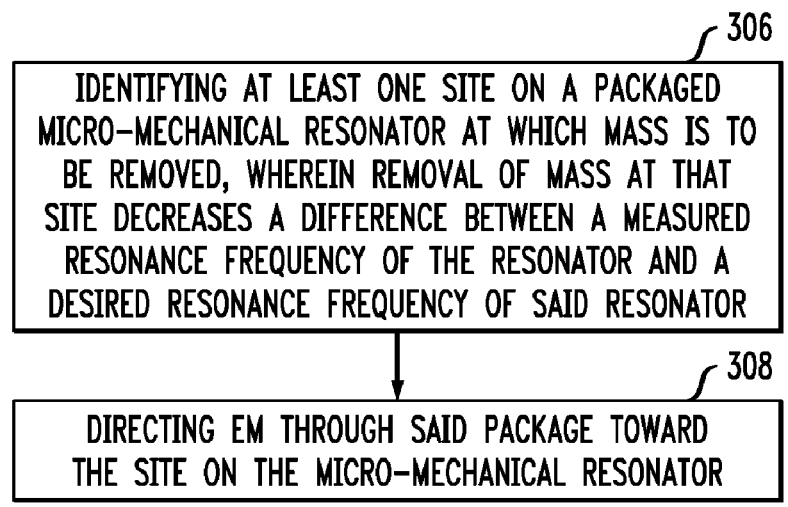
FIG. 3 depicts a flow diagram of a variation of the method depicted in FIG. 1.

FIG. 3 depicts a flow diagram of the salient operations of method 300, which is a variation of method 100. Operation 306 of method 300 requires identifying at least one site on a packaged micro-mechanical resonator at which mass will be removed. Removal of mass at that site decreases a difference between the actual (i.e., measured) resonance frequency of a resonator (e.g., resonator 208) and the targeted or desired resonance frequency of the resonator. In accordance with operation 308, electromagnetic energy is directed to the site on the resonator through the package.

As mentioned in the Background section of this Specification, it is desirable to trim the resonance frequency of a resonator after it has been packaged. This is advantageous (but not required) because the package itself, as well as the presence of a vacuum, affects the resonance frequency of a resonator.

Figure 4:
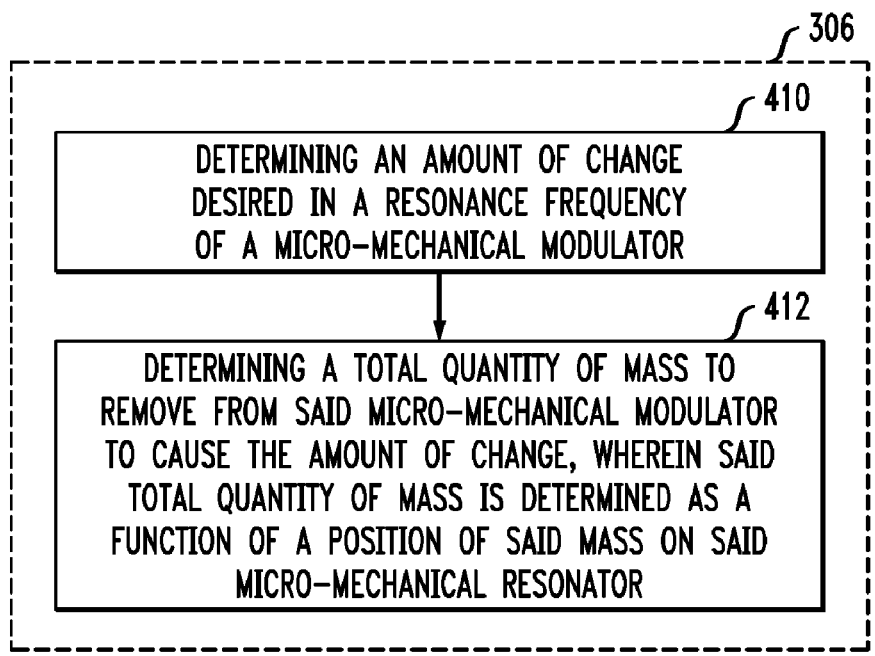
FIG. 4 depicts a flow diagram of an embodiment of the method depicted in FIG. 3.
Figure 5:
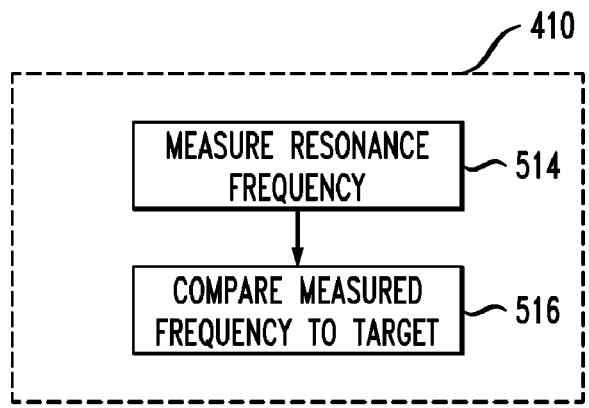
FIG. 5 depicts a flow diagram of an embodiment of the method depicted in FIG. 4.

In some embodiments, operation 306 includes sub-operations 410 and 412, which are depicted in FIG. 4. Sub-operation 410 requires determining an amount of change desired in the resonance frequency of a packaged micro-mechanical resonator. In some embodiments, sub-operation 410 includes sub-operations 514 and 516, which are depicted via flow diagram in FIG. 5. Sub-operation 514 requires measuring the resonance frequency of a packaged resonator. In sub-operation 516, the measured resonance frequency (operation 514) is compared with a desired or target resonance frequency.

Figure 6:
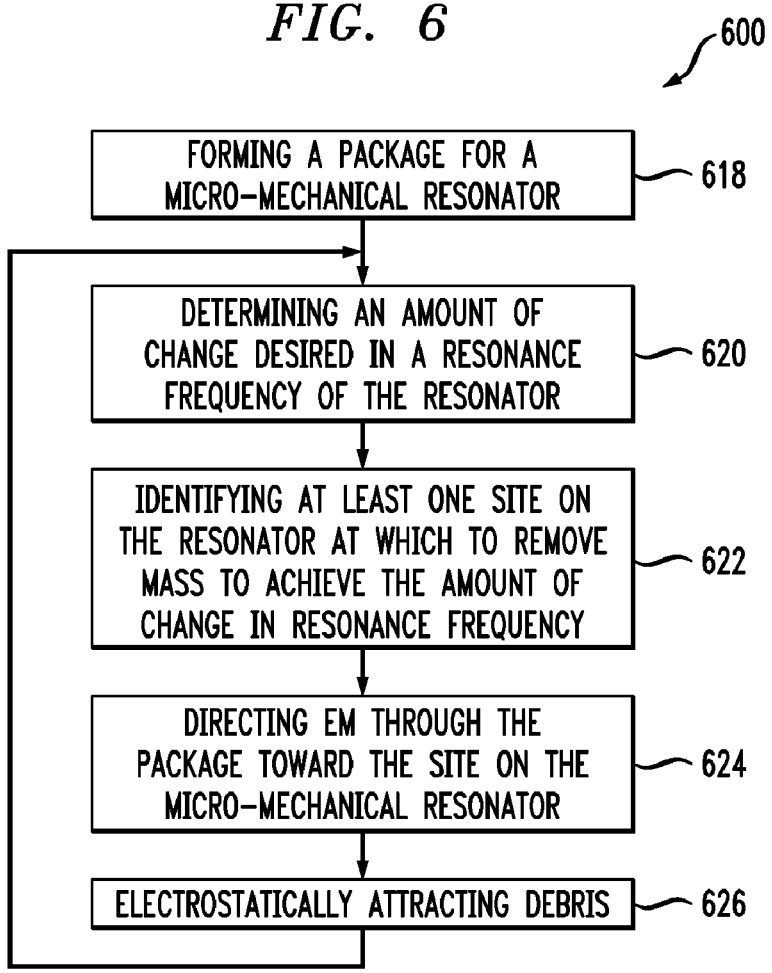
FIG. 6 depicts a flow diagram of a variation of the methods depicted in FIGS. 1, 3, and 4.

Description of sub-operation 412 is deferred until after the description of method 600, which is yet another variation of method 100. Method 600, which is depicted in FIG. 6, combines some of the operations and sub-operations that were previously described as variations of method 100. More particularly, method 600 includes, in some embodiments:

Operation 618—Forming a package for a micro-mechanical resonator (see FIG. 1, operation 102).

Operation 620—Determining an amount of change desired in a resonance frequency of the resonator (see FIG. 4, sub-operation 410).

Operation 622—Identifying at least one site on the resonator at which to remove mass to achieve the amount of change desired (see FIG. 3, operation 306).

Operation 624—Directing electromagnetic energy through the package toward the site on the resonator (see FIG. 3, operation 308).

Operation 626—Electrostatically attracting debris resulting from contact of the electromagnetic energy with the site on the resonator.

After operation 626, processing continues by repeating operation 620. If it is determined, in operation 620, that no further change in resonance frequency is desired, method 600 ends. Otherwise, processing continues with operation 622.

Sub-operation 412 is now described. Sub-operation 412 requires a determination of a total quantity of mass to remove from a resonator to cause a desired amount of change in resonance frequency. Sub-operation 412 also specifies that the total quantity of mass to be removed is determined as a function of the position of the mass (on the resonator), as well as some other considerations described later in this specification.

As described by Wang et al. in "VHF Free-Free Beam High-Q Micromechanical Resonators," J. Microelectromechanical Systems, v(9), no. 3, pp. 350 (September 2000), the resonance frequency of a micro-mechanical resonator is a function of the stiffness and the mass of its resonant element, among other parameters. And stiffness and mass are location dependent. The location dependence derives from the velocity dependence of these quantities, and thus are functions of the resonance mode shape of the resonant element.

Figure 7:
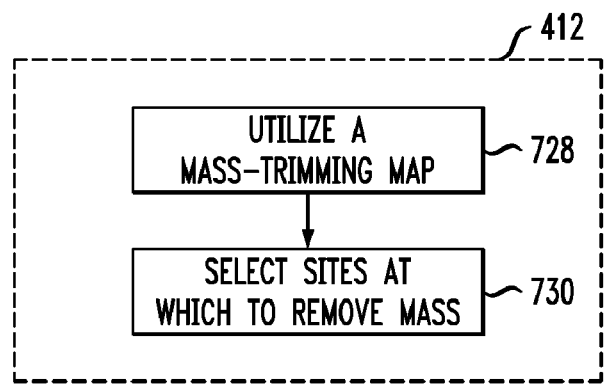
FIG. 7 depicts a flow diagram of an embodiment of the method depicted in FIG. 4.

In some embodiments, sub-operation 412 includes sub-operations 728 and 730, as depicted in FIG. 7. Sub-operation 728 requires the use of a mass-trimming map that identifies a plurality of potential sites on the resonator at which to remove mass. Sub-operation 730 recites selecting sites from the map. These sites map to locations on the resonator at which mass will be removed.

With regard to sub-operation 730, Wang et al. can be used to predict resonance frequency as a function of location-dependent mass and stiffness for a "free-free" beam resonator. The "free-free" descriptor refers to the fact that, by virtue of the location and structure of the supports for the resonating element (i.e., the beam), the resonating element ideally sees zero impedance into its supports and effectively operates as if levitated without any supports. Those skilled in the art can develop expressions for different resonator structures to predict resonance frequency as a function of location-dependent mass, etc.

Figure 8:
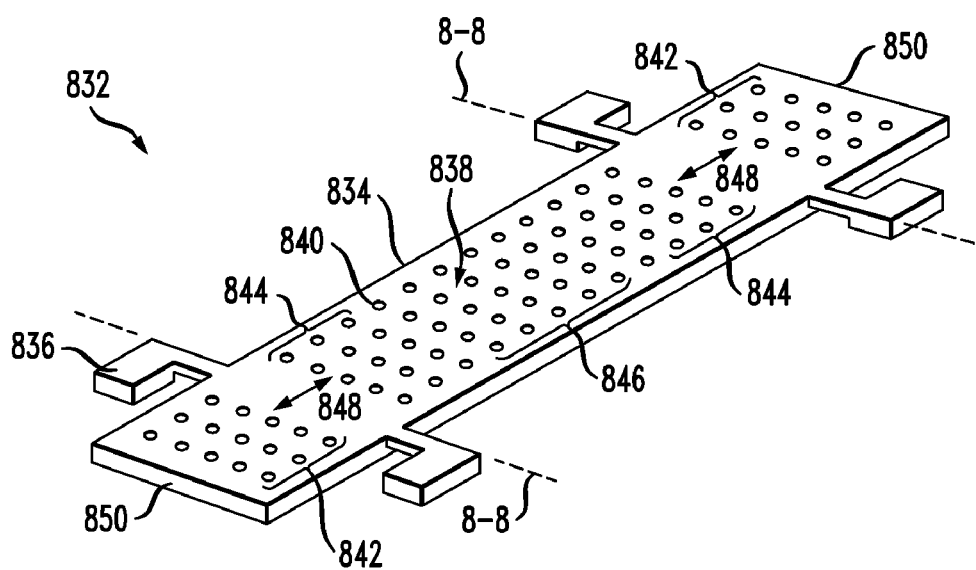
FIG. 8 depicts a mass-trimming map in accordance with the illustrative embodiment of the present invention.

With regard to sub-operation 728, FIG. 8 depicts free-free beam resonator 832 having resonant element or beam 834 and supports 836. Mass-trimming map 838 is superimposed on resonator 832. It will be understood that map 838 does not actually appear on resonator 832; it is superimposed or mapped onto beam 834 in FIG. 8 for clarity of explanation. For ease of description, map 838 of sites 840 and the mapping of those sites onto beam 834 will often not be distinguished. In other words, in at least some instances, no distinction will be made between a region of map 838 and that same region on beam 834.

Mass-trimming map 838 identifies a plurality of potential sites 840 at which to remove mass from beam 834. Removing mass from beam 834 at any of sites 840 will affect the resonance frequency of resonator 832. In the embodiment depicted in FIG. 8, sites 840 are arranged in an array that covers the upper surface of beam 834.

In light of earlier disclosure, it will be understood that removing mass at one particular site 840 on beam 834 will not, necessarily, cause the same amount of change in the resonance frequency of beam 834 as removing the same amount of mass from another site 840.

In fact, as a function of a site's location, sites 840 can be categorized as relatively "fine-tuning" or relatively "coarse-tuning." For a free-free resonator such as resonator 208, it is convenient to reference sites 840 as a function of their position relative to nodal lines 8—8 and the center of beam 834. For a free-free resonator such as resonator 208, fine-tuning sites 842 and 844 are disposed relatively closer to nodal lines 8—8 while coarse-tuning sites are disposed relatively further from nodal lines 8—8 and closer to the middle of beam 834. Removing mass at fine-tuning sites 842 and 844 results in a relatively smaller change in the resonance frequency of beam 834 as compared to removing the same amount of mass at coarse-tuning sites 846.

In some embodiments, no potential mass-trimming sites 840 are located in region 848 along or very near to (within a few microns of) nodal lines 8—8. This indicates that mass should not be removed from this region of resonator 832. The reason for this is to avoid damaging relatively delicate supports 836, which are coupled to beam 834 along nodal lines 8—8.

It will be understood that number of sites 840 depicted in map 838 is representative; the actual number of sites is a function of the size of resonant element 834, the spacing of sites 840 and the expected divot size. Furthermore, while the relative locations of sites 840 that are identified as "fine-tuning" or "coarse tuning" are correct for at least some embodiments, it is to be understood that the specific number of rows that are shown to include fine-tuning sites or coarse-tuning sites and the specific location of those rows is intended to be representative. That is, the designation of three rows of sites 840 to either side of nodal lines 8—8 as "fine-tuning" sites is strictly illustrative. It will be appreciated that, to some degree, the designations "fine-tuning" and "coarse-tuning" are arbitrary and can be assigned a variety of different ranges. That is, as a function of application specifics, it might be equally appropriate to designate a "fine-tuning" site as a site that can trim the resonance frequency in a range of 0.005% to 0.1%, or 0.01% to 0.1%, or 0.075% to 0.15%, etc.

The spacing of sites 840 and the amount of mass removed from each site is dependent upon several factors, including the focus limit of EM source 226 and a desire to limit the amount of debris generated during mass removal. For example, in embodiments in which EM source 226 is a femtosecond laser, the minimum material removal threshold is an energy level of approximately 10 nanojoules and the focus limit is about 0.5 microns. Furthermore, it is advantageous to limit the energy of electromagnetic energy 224 that is delivered to beam 834 to about 50 nanojoules to restrict the amount of debris generated during mass removal.

Delivering 10 nanojoules of energy to beam 832 creates a divot or dimple that is about 250 nanometers wide and about 250 nanometers deep. Delivering 50 nanojoules of energy to beam 834 creates a divot that is about 1 micron wide and about 1 micron deep. Delivering 35 nanojoules of energy, as a desirable average within the specified range, creates a divot in beam 834 that is about 700 nanometers wide and 700 nanometers deep. Based on these dimensions, each potential mass-trimming site 840 on mass-trimming map 838 is spaced from its nearest neighbors by at least about 1 micron.

For a divot having a size of about 700 nanometers in width and depth, fine-trimming sites provide an ability to trim the resonance frequency in increments within a range of about 0.01% to about 0.1%, as a function of position. Coarse-trimming sites provide an ability to trim the resonance frequency in increments within a range of about 0.1% to about 5%, as a function of position. In particular, the coarsest trimming sites (e.g., 5%, etc.) are located near the middle of beam 834.

Fine-trimming sites 842 that are located nearer to ends 850 of beam 834 provide a finer degree of control than fine-trimming sites 844 that are located nearer to the center of beam 834.

Typically, mass will be removed from beam 834 at only some of the many available locations (i.e., at only some of potential mass-trimming sites 840 shown in mass trimming map 838). In some embodiments, the same amount of mass is removed from each such site.

The method provides an ability to tune the resonance frequency of a resonator while not substantially affecting its quality factor, Q. This is done in by selecting a symmetrical arrangement of mass-trimming sites 840. An example of this is depicted in FIG. 9A, wherein mass is removed at sites 954 (the selected mass-trimming sites 840), which are symmetrically arranged with respect to center of mass 952 of beam 834.

The method also provides an ability to tune both the resonance frequency and the quality factor of a resonator. This is done by selecting an asymmetric arrangement of mass-trimming sites 840. An example of this is depicted in FIG. 9B, wherein mass is removed at sites 954, which are asymmetrically arranged with respect to center 952 of beam 834.

It is expected that as the technical capabilities of EM sources 226 improve, divots having a size of about 150 nanometers in width and depth can repeatedly and accurately be formed. And, naturally, the ability to create a relatively smaller divot will equate to a relatively finer tuning capability for the method.

Furthermore, a finer tuning capability can be provided by selectively using electrodes 238A and 238B (FIG. 2). As previously described, when biased, these electrodes generate an electrostatic force that attracts debris that is formed during mass removal. To the extent that the electrodes are deactivated during the process of mass removal, some mass will redeposit on beam 834. This provides, effectively, an ability to remove less mass than might otherwise be possible, the result of which is a smaller change in resonance frequency. It will be appreciated, however, that some degree of control over the process is sacrificed when using this technique.

Sub-operation 730, which requires selecting sites at which to remove mass, can be carried out in a variety of ways. For example, in some embodiments, an algorithm can be used to select a group of sites that should, after mass removal, fully trim the resonator to bring the actual resonance frequency in line with the desired resonance frequency. The algorithm is advantageously based on a correlation between the desired resonance frequency and parameters that affect the resonance frequency, such as spring constant, total resonator mass, and the resonator geometry. See, e.g., Wang et al. in "VHF Free-Free Beam High-Q Micromechanical Resonators," J. Microelectromechanical Systems, v(9), no. 3, pp. 350 (September 2000), describing the correlation between resonance frequency and certain parameters. In some embodiments, finite-element modeling, known to those skilled in the art, is used to determine at which locations to remove mass and how much mass to remove at those locations.

Alternatively, in some other embodiments, a more iterative process can be employed. In particular, after measuring resonance frequency, mass can be removed at one or more coarse-tuning sites. After removing mass at selected coarse-tuning sites, the resonance frequency is re-checked. If the differential between the actual and desired resonance frequency is reduced to an appropriate amount, additional mass is then removed at fine-tuning sites, and so forth. In some embodiments, the algorithm selects sites so that mass is removed at a minimum number of sites.

It was mentioned earlier that at least a portion of package 206 must be transparent, at the operating wavelength of EM source 226, so that electromagnetic energy 224 can reach resonator 208 (see, e.g., FIG. 2). The glass cap must be smooth and distortion free to enable focused laser transmission through the glass, as is required in the laser trimming operation. The glass cannot be etched, because etch methods typically dull or pattern the glass, such that focused laser transmission would not be possible. FIG. 10 depicts an illustrative embodiment of method 1000 for forming an optically-transparent cap and FIG. 11 depicts package 206 that includes optically-transparent cap 1166.

In accordance with operation 1056 of method 1000, a positive image of the physical profile of the desired optically-transparent cap is created on a silicon wafer ("forming tool"). The structure of the image can be visualized from optically-transparent cap 1166 depicted in FIG. 11. In particular, the positive image would be the "negative" of the surface of cap 1166 that faces device wafer 214 (that includes MEMS device 208). The positive image can be created by deposition, isotropic etching, anisotropic etching, and/or surface micromachining in known fashion. As per operation 1058, a wafer comprising an optically-transparent material, such as a blank glass (e.g., Pyrex™, etc.) wafer, is laid over the image on the forming tool. The wafer is pushed into the positive features on the forming tool, as indicated in operation 1060. To accomplish this, in some embodiments, the wafer and forming tool are inserted into a conventional wafer bonder. The wafer bonder is operated at temperatures just above the softening point of the wafer of optically-transparent material as pressure is applied to it and the forming tool. The wafer and the forming tool are then cooled to room temperatures. As per operation 1062, the forming tool is removed from the wafer (newly-formed cap) by a process, such as a selective chemical etch, that does not substantially affect the wafer.

In a variation of method 1000, a surface layer of silicon nitride is formed as a coating on the forming tool. It is advantageously added to the entire silicon surface that contacts the optically-transparent material. In some embodiments, the positive image of the desired optically-transparent cap can be formed directly on the silicon nitride. In some other embodiments, the positive image is formed on the silicon surface of the forming tool, and then silicon nitride is conformally deposited. The profile of the silicon nitride surface mirrors the positive image that was formed on the silicon surface of the forming tool. The wafer of optically-transparent material is then brought into contact with the silicon nitride, rather than the silicon surface of the forming tool. The bonding is done in the presence of an inert gas (e.g., nitrogen, argon, etc.). Relief angles are advantageously added to the vertical features of forming tool.

When the cap is formed without a nitride coating and without an inert gas atmosphere, glass and silicon will bond, requiring a chemical etch for separation, as described above. The presence of the silicon nitride and an inert atmosphere substantially prevents oxide bonding between glass and the silicon forming tool.

Once formed, the cap can be used to create MEMS package 206 via wafer-level-packaging. In other words, the package is formed by attaching device wafer 214 and optically-transparent cap 1166 to one another, as per operation 1064. Processes suitable for creating a wafer-to-wafer bond between cap 1166 and device wafer 214 include, without limitation, anodic bonding, thermocompression bonding, low-temperature fusion bonding, solder bonding, and glass-frit bonding. Alternatively, other ways to hermetically seal the cap on a device wafer, such as those employing direct bonding of materials commonly used in existing semiconductor processing can also be used. Any of these wafer-level joining/sealing processes can be used to join the glass cap to a device wafer to create a package. In package 206 depicted in FIG. 11, standoffs 1168 create moat 1170 that receives glass frit or solder 1172, which creates the hermetic seal after bonding/attachment.

It is to be understood that the above-described embodiments are merely illustrative of the present invention and that many variations of the above-described embodiments can be devised by those skilled in the art without departing from the scope of the invention. For example, in the embodiments described herein, fine-tuning sites and coarse-tuning sites are conveniently defined as a function of the position of those sites with respect to nodal lines. In other embodiments, and in particular for other resonator structures, the fine-tuning sites and coarse-tuning sites can be referenced to some other feature or site on the resonator, as appropriate. It is therefore intended that such variations be included within the scope of the following claims and their equivalents.

We claim:

1. A method comprising:
    determining an amount of change desired in a resonance frequency of a micro-mechanical resonator; and
    determining a quantity of mass to remove from said micro-mechanical resonator to cause said amount of change, wherein said quantity of mass is determined as a function of a position of said mass on said micro-mechanical resonator.

2. The method of claim 1 wherein determining a quantity of mass further comprises determining a plurality of sites on said micro-mechanical resonator from which to remove said mass to cause said amount of change.

3. The method of claim 2 further comprising removing said quantity of mass from said plurality of sites.

4. The method of claim 3 wherein an equal amount of mass is removed from each of said sites.

5. The method of claim 3 wherein determining a plurality of sites further comprises selecting sites that are symmetrically located relative to a center of said micro-mechanical resonator.

6. The method of claim 3 further comprising changing a quality factor of said micro-mechanical resonator by selecting sites that are asymmetrically located relative to a center of said micro-mechanical resonator.

7. The method of claim 3 further comprising removing said quantity of mass from said micro-mechanical resonator by ablating a portion of said quantity of mass from each of said sites, wherein ablation forms a divot at each said site.

8. The method of claim 7 wherein said portion ablated from each said site is equal.

9. The method of claim 7 wherein said divot has a diameter that is within a range of about 150 to about 800 nanometers.

10. The method of claim 7 wherein removing said quantity of mass further comprises directing an amount of electromagnetic energy toward each said site for a period of time, wherein said amount of electromagnetic energy and said period of time is suitable for removing said portion of said quantity of mass from each said site, but will not substantially heat said micro-mechanical resonator other than at said site.

11. The method of claim 10 wherein directing an amount of electromagnetic energy further comprises illuminating each said site with a femtosecond laser.

12. The method of claim 10 wherein said amount of electromagnetic energy directed toward each site is within a range of about 10 nanojoules to about 50 nanojoules.

13. The method of claim 10 wherein said period of time is about 150 femtoseconds or less.

14. The method of claim 2 wherein each of said sites are characterized as belonging to at least one of either a first region and a second region, wherein:
said first region is proximal to a nodal line of said micro-mechanical resonator; and
said second region is distal to said nodal line; and
wherein determining a plurality of sites further comprises selecting said sites from at least one of said first region and said second region as a function of said amount of change desired in said resonance frequency.

15. The method of claim 14 wherein said first region comprises:
a first sub-region that is disposed on a first side of said nodal line, wherein said first side is distal to a center of said micro-mechanical resonator; and
a second sub-region that is disposed on a second side of said nodal line, wherein said second side is proximal to said center of said micro-mechanical resonator; and
wherein determining a plurality of sites further comprises selecting said sites from at least one of said first sub-region and said second sub-region as a function of said amount of change desired in said resonance frequency.

16. The method of claim 1 wherein determining an amount of change further comprises:
measuring a resonance frequency of said micro-mechanical resonator; and
comparing the measured resonance frequency with a desired resonant frequency.

17. A method for trimming a resonance frequency of a micro-mechanical resonant element, the method comprising removing mass from a plurality of sites on said micro-mechanical resonant element, wherein an amount of said mass that is removed at said pluarity of sites creates a divot that is less than about 1 micron in width and about 1 micron in depth, and wherein said plurality of sites define a symmetrical arrangement with respect to a center of mass of said resonant element.

18. The method of claim 17 wherein said resonant element is encapsulated in a package and is under vacuum.

19. A method for trimming a resonance frequency of a micro-mechanical resonant element, the method comprising:
removing mass from a plurality of sites on said micro-mechanical resonant element, wherein said plurality of sites define a symmetrical arrangement with respect to a center of mass of said resonant element; and
electrostatically attracting, away from said resonant element, said mass that is removed.

20. A method for trimming a resonance frequency of a micro-mechanical resonant element, the method comprising removing mass using a femtosecond laser, wherein said mass is removed from a plurality of sites on said micro-mechanical resonant element, and wherein said plurality of sites define a symmetrical arrangement with respect to a center of mass of said resonant element.

21. The method of claim 20 wherein energy delivered from said femtosecond laser to each of said sites is in a range about 10 nanojoules to about 50 nanojoules, per site.

22. The method of claim 20 wherein energy delivered by said femtosecond laser is delivered in about 150 femtoseconds or less, per site.

23. A method for trimming a resonance frequency of a micro-mechanical resonant element, the method comprising removing mass from a plurality of sites on said micro-mechanical resonant element, wherein said plurality of sites define a symmetrical arrangement with respect to a center of mass of said resonant element, and said symmetrical arrangement is based on an expression that relates resonance frequency of said resonant element to location-dependent mass.

24. An article comprising:
a package comprising a sealed cavity, wherein a pressure in said sealed cavity is below atmospheric pressure;
a micro-mechanical resonator, wherein said micro-mechanical resonator is disposed in said sealed cavity, and wherein said micro-mechanical resonator comprises a suspended beam, and wherein said beam comprises:
a major surface;
a plurality of divots in said major surface, wherein said divots are less than 1 micron in diameter and less than 1 micron deep.

25. The article of claim 24 wherein said divots are symmetrically disposed on said major surface of said beam.

26. The article of claim 24 wherein said divots are asymmetrically disposed on said major surface of said beam.

27. The article of claim 24 wherein said divots are spaced apart by at least one micron.

28. The article of claim 24 wherein at least a portion of said package is transparent to infrared radiation.

29. The article of claim 24 wherein said beam comprises a silicon-containing material.

30. A method comprising changing a resonance frequency and a quality factor of a micro-mechanical resonator by removing a quantity of mass from said micro-mechanical resonator, wherein said quantity of mass removed is determined as a function of a position of said mass on said micro-mechanical resonator, and wherein said quantity of mass is removed is asymmetrically located relative to a center of said micro-mechanical resonator.

* * * * *